United States Patent
Sano et al.

(10) Patent No.: US 7,723,245 B2
(45) Date of Patent: May 25, 2010

(54) METHOD FOR MANUFACTURING SEMICONDUCTOR DEVICE, AND SUBSTRATE PROCESSING APPARATUS

(75) Inventors: Atsushi Sano, Toyama (JP); Sadayoshi Horii, Toyama (JP); Hideharu Itatani, Nanto (JP); Katsuhiko Yamamoto, Himi (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 284 days.

(21) Appl. No.: 11/791,222

(22) PCT Filed: Nov. 29, 2005

(86) PCT No.: PCT/JP2005/021855
§ 371 (c)(1),
(2), (4) Date: Jun. 29, 2007

(87) PCT Pub. No.: WO2006/057400
PCT Pub. Date: Jun. 1, 2006

(65) Prior Publication Data
US 2008/0032514 A1   Feb. 7, 2008

(30) Foreign Application Priority Data
Nov. 29, 2004   (JP) .............................. 2004-344755

(51) Int. Cl.
*H01L 21/31*   (2006.01)
(52) U.S. Cl. .................... 438/785; 438/680; 438/681
(58) Field of Classification Search ................. 438/785, 438/680, 681
See application file for complete search history.

(56) References Cited

U.S. PATENT DOCUMENTS

| | | |
|---|---|---|
| 2002/0175393 A1 | 11/2002 | Baum et al. |
| 2004/0171276 A1 | 9/2004 | Watanabe et al. |
| 2005/0048799 A1 * | 3/2005 | Machida et al. .............. 438/785 |

FOREIGN PATENT DOCUMENTS

| | | |
|---|---|---|
| JP | A-2004-006699 | 1/2004 |
| JP | A-2004-529495 | 9/2004 |
| WO | WO 2003/019643 A1 | 3/2003 |

OTHER PUBLICATIONS

Notification of Reason(s) for Refusal in Japanese Patent Application No. 2006-547932, Dec. 24, 2009 (Translation).

* cited by examiner

*Primary Examiner*—Walter L Lindsay, Jr.
*Assistant Examiner*—Reema Patel
(74) *Attorney, Agent, or Firm*—Oliff & Berridge, PLC (57) ABSTRACT

The ability to control a concentration ratio of a metal and silicon in a metal silicate film is improved, allowing a high-quality semiconductor device to be manufactured.

A step is provided for supplying a first raw material, which contains a metal atom, and a second raw material, which contains a silicon atom and a nitrogen atom, into a processing chamber (4); and forming on a substrate (30) a metal silicate film containing the metal atom and silicon atom. A raw material supply ratio of the first and second raw materials is controlled in the step of forming a metal silicate film, thereby controlling a concentration ratio of the metal and silicon in the resulting metal silicate film.

8 Claims, 6 Drawing Sheets

METHOD FOR MANUFACTURING SEMICONDUCTOR DEVICE, AND SUBSTRATE PROCESSING APPARATUS

TECHNICAL FIELD

The present invention relates to a substrate processing apparatus and to a method for manufacturing a semiconductor device for processing a semiconductor wafer or another substrate.

BACKGROUND ART

One of the steps for manufacturing a semiconductor is a step in which a predetermined film-forming treatment is carried out on the surface of a substrate (a treated substrate in which a fine electrical circuit pattern is formed using a silicon wafer, glass, or the like as a base). Among such predetermined film-forming treatments, methods are being actively researched in which the electrical film of a gate insulation film is made thinner and a silicon (Si) oxide film/oxynitride film is converted to a High-k (high dielectric constant) film in a step in which a gate insulation film is formed. Sputtering and CVD (Chemical Vapor Deposition) are being studied as methods for forming $ZrO_2$, $HfO_2$, and other High-k films. CVD is widely used for mass production due to the advantages in step coatability and other properties, as well as the ease with which the raw materials for forming the film can be exchanged.

MOCVD (Metal Organic Chemical Vapor Deposition), which is one type of CVD, is used to form High-k films. In MOCVD, an organometallic raw material is used as the raw material gas. There are various organometallic raw materials, and each of these materials has been researched. Examples of $HfO_2$ and $HfSiO_4$ raw materials that are used include $Hf[OC(CH_3)_3]_4$ (Hf-OtBu), $Hf[OC(CH_3)_2CH_2OCH_3]_4$ ("Hf-MMP" hereunder), $Si[OC(CH_3)_2CH_2OCH_3]_4$ ("Si-MMP" hereunder), $Hf[O—Si—(CH_s)]_4$ (Hf—OSi), and $Si(OC_2H_3)_4$ (TEOS). Among these, Hf-MMP and Si-MMP are liquid at about 30° C. and normal pressure. Therefore, such liquid raw materials are heated and, depending on the vapor pressure, are converted to a gas before being used. There are CVD methods that use Hf-MMP, which is one of the MOCVD raw materials (e.g., see Patent Document 1).

[Patent Document 1]
JP-A 2004-6699

DISCLOSURE OF THE INVENTION

Problems that the Invention is Intended to Solve

Si is introduced into $HfO_2$ films in order to keep them in an amorphous state. $HfO_2$ films into which Si has been introduced; i.e., oxidized films containing a Hf atom and a Si atom, are called hafnium silicate films ("HfSiO films" hereunder). Introducing Si into an $HfO_2$ film makes it possible to adequately introduce nitrogen into the HfSiO film. In structures wherein boron is introduced to the upper electrode, nitrogen acts to prevent boron from penetrating the substrate.

The nitrogen distribution in certain HfSiO films has traditionally been controlled by controlling the conditions and methods used when nitrogen is introduced into such films. As is particularly the case when used as a gate insulation film, and characteristics of the transistor will be diminished when nitrogen is introduced into the interface between the film and the Si, which is the substrate and the active region of the gate. This is because the nitrogen obstructs the electron channels, and impedes the migration of electrons in the active region of the transistor. Accordingly, the introduction of nitrogen into the interface between the HfSiO film and the Si must be controlled. However, complications are presented in controlling the nitrogen concentration in silicate films so that nitrogen will not be introduced into the interface.

Such a phenomenon is not unique to HfSiO films, but is common in metal silicate films containing a metal atom and a silicon atom.

The present invention overcomes such problems with the prior art. It is an object of the present invention to provide a substrate processing apparatus and method for manufacturing a semiconductor device configured so that the nitrogen concentration distribution in a metal silicate film will be controlled by controlling the concentration ratio of the metal atom and the silicon atom in the metal silicate film. The ability to control the concentration ratio of the metal atom and the silicon atom in the metal silicate film can be improved, and a high-quality semiconductor device can be manufactured.

Means for Solving the Above-Mentioned Problems

A first aspect of the invention is a method for manufacturing a semiconductor device including the steps of loading a substrate into a processing chamber; supplying a first raw material, which contains a metal atom, and a second raw material, which contains a silicon atom and a nitrogen atom, into the processing chamber, and forming on the substrate a metal silicate film containing the metal atom and the silicon atom; and unloading from the processing chamber the substrate after film formation; wherein a raw material supply ratio of the first raw material and second raw material is controlled in the step of forming the metal silicate film, whereby a concentration ratio of the metal atom and the silicon atom in the resulting metal silicate film is controlled.

When the metal silicate film is formed, a raw material containing a silicon atom and a nitrogen atom is used as the second raw material, and the raw material supply ratio of the first and second raw materials is controlled. The concentration ratio of the metal atom and the silicon atom in the resulting metal silicate film is thereby controlled, whereupon it is possible to improve the ability to control the concentration ratio in the metal silicate film.

A second aspect of the invention is the method for manufacturing a semiconductor device of the first aspect wherein the second raw material is $Si[OCH(CH_3)CH_2N(CH_3)_2]_4$ or $Si[OC(CH_3)_2CH_2N(CH_3)_2]_4$.

The ability to control the concentration ratio in the metal silicate film can be further improved if the second raw material is $Si[OCH(CH_3)CH_2N(CH_3)_2]_4$ or $Si[OC(CH_3)_2CH_2N(CH_3)_2]_4$.

A third aspect of the invention is the method for manufacturing a semiconductor device of the first aspect wherein the first raw material is $Hf[OC(CH_3)_2CH_2OCH_3]_4$, and the second raw material is $Si[OCH(CH_3)CH_2N(CH_3)_2]_4$ or $Si[OC(CH_3)_2CH_2N(CH_3)_2]_4$.

The ability to control the concentration ratio of the hafnium and silicon in a hafnium silicate film can be improved if the first raw material is $Hf[OC(CH_3)_2CH_2OCH_3]_4$, and the second raw material is $Si[OCH(CH_3)CH_2N(CH_3)_2]_4$ or $Si[OC(CH_3)_2CH_2N(CH_3)_2]_4$.

A fourth aspect of the invention is the method for manufacturing a semiconductor device of the first aspect wherein the metal is hafnium, and the film formed in the step of forming a metal silicate film is a hafnium silicate film.

The ability to control the concentration ratio of hafnium and silicon in the hafnium silicate film can be improved if the metal is hafnium, and the film formed in the step of forming a metal silicate film is a hafnium silicate film.

A fifth aspect of the invention is the method for manufacturing a semiconductor device of the first aspect wherein the first raw material is $Hf[OC(CH_3)_2CH_2OCH_3]_4$; the second raw material is $Si[OCH(CH_3)CH_2N(CH_3)_2]_4$; the metal silicate film is a hafnium silicate film; and, in a step of forming the metal silicate film, a step of vaporizing the first raw material and the second raw material, supplying the vaporized raw materials to the processing chamber, and forming the hafnium silicon film on a substrate via MOCVD is repeated with a reforming step of supplying into the processing chamber a gas that is different from the first raw material and the second raw material, and reforming the hafnium silicate film, whereby a hafnium silicate film is formed to a desired thickness on the substrate.

The ability to control the raw material supply ratio will be improved and the ability to control the concentration ratio in the metal silicate film can be further improved if variation in the raw material supply ratio is minimized when the sequential process is thus performed.

A sixth aspect of the invention is the method for manufacturing a semiconductor device of the fifth aspect wherein a gas that is activated by remote plasma is used in the reforming step.

The reforming can be performed efficiently and the manufacturing device can be reduced in size when a gas that is activated by remote plasma is used in the reforming step.

A seventh aspect of the invention is the method for manufacturing a semiconductor device of the sixth aspect wherein the gas activated by remote plasma is a gas that contains oxygen or a gas that contains nitrogen.

The gas activated by remote plasma is preferably a gas that contains oxygen or a gas that contains nitrogen.

An eighth aspect of the invention is the method for manufacturing a semiconductor device of the fifth aspect wherein, in the film forming step, the first raw material and the second raw material vaporized respectively and subsequently fed into the processing chamber without being mixed in advance.

The ability to control the raw material supply ratio will be improved and the ability to control the concentration ratio in the metal silicate film can be further improved if the first raw material and the second raw material vaporized respectively and subsequently fed into the processing chamber without being mixed in advance.

The ninth aspect of the invention is the method for manufacturing a semiconductor device of the fifth aspect, wherein in the film forming step, the first raw material and the second raw material vaporized respectively, subsequently mixed, and then fed into the processing chamber.

The ability to control the raw material supply ratio will be improved and the ability to control the concentration ratio in the metal silicate film can be further improved if the first raw material and the second raw material vaporized respectively, subsequently mixed, and then fed into the processing chamber.

A tenth aspect of the invention is the method for manufacturing a semiconductor device of the fifth aspect wherein, in the film forming step, a mixed raw material, which is obtained by mixing either the first raw material or the second raw material with the other, is vaporized and subsequently fed into the processing chamber.

The ability to control the raw material supply ratio will be improved and the ability to control the concentration ratio in the metal silicate film can be further improved if a mixed raw material, which is obtained by mixing either the first raw material or the second raw material with the other, is vaporized and subsequently fed into the processing chamber.

An eleventh aspect of the invention is the method for manufacturing a semiconductor device of the fifth aspect wherein, in the film forming step, a raw material supply ratio Hf/(Hf+Si) is controlled, whereby a concentration ratio Hf/(Hf+Si) of Hf atom and Si atom in the resulting hafnium silicate film is controlled.

The ability to control the raw material supply ratio will be improved and the ability to control the concentration ratio in the hafnium silicate film can be further improved if the above raw materials are used and a raw material supply ratio is controlled, whereby a concentration ratio of Hf atom and Si atom in the resulting hafnium silicate film is controlled.

A twelfth aspect of the invention is the method for manufacturing a semiconductor device of the eleventh aspect wherein, in the film forming step, the raw material supply ratio Hf/(Hf+Si) is continuously or gradually varied, whereby the concentration ratio Hf/(Hf+Si) of Hf atom and Si atom in the resulting hafnium silicate film is controlled in a depth direction.

The ability to control the concentration ratio of the Hf atom and Si atom in the hafnium silicate film can be further improved, even if the raw material supply ratio is thus continuously or gradually varied. Further, if the concentration ratio of the Hf atom and Si atom in the resulting hafnium silicate film is thus controlled in a depth direction, the ability to control the concentration ratio of the Hf atom and Si atom in the depth direction will also be improved. It will also be possible to obtain a desired nitrogen concentration distribution in the depth direction in the film when the hafnium silicate film is subsequently subjected to nitridation.

A thirteenth aspect of the invention is a substrate processing apparatus including: a processing chamber for processing a substrate; a supply port for supplying a first raw material, which contains the metal atom, into the processing chamber; a supply port for supplying a second raw material, which contains the silicon atom and the nitrogen atom, into the processing chamber; and controller for controlling a raw material supply ratio of the first raw material and second raw material in order to control a concentration ratio of the metal atom and the silicon atom in a metal silicate film formed on the substrate.

The first raw material is supplied to the processing chamber from the supply port for supplying the first raw material, the second raw material, which contains the silicon atom and nitrogen atom, is supplied to the processing chamber from the supply port for supplying the second raw material, and a metal silicate film is formed on the substrate. When this happens, the controller controls the raw material supply ratio of the first raw material and second raw material, whereby the concentration ratio of the metal atom and the silicon atom in the resulting metal silicate film is controlled. The ability to control the concentration ratio in the metal silicate film is then controlled.

A fourteenth aspect of the invention is the substrate processing apparatus of the thirteenth aspect wherein the second raw material the second raw material is $Si[OCH(CH_3)CH_2N(CH_3)_2]_4$ or $Si[OC(CH_3)_2CH_2N(CH_3)_2]_4$.

The ability to control the concentration ratio in the metal silicate film can be further improved if the second raw material is $Si[OCH(CH_3)CH_2N(CH_3)_2]_4$ or $Si[OC(CH_3)_2CH_2N(CH_3)_2]_4$.

A fifteenth aspect of the invention is the substrate processing apparatus of the thirteenth aspect wherein the first raw material is $Hf[OC(CH_3)_2CH_2OCH_3]_4$, and the second raw material is $Si[OCH(CH_3)CH_2N(CH_3)_2]_4$ or $Si[OC(CH_3)_2CH_2N(CH_3)_2]_4$.

The ability to control the concentration ratio of the Hf atom and Si atom in a hafnium silicate film can be improved if the first raw material is $Hf[OC(CH_3)_2CH_2OCH_3]_4$, and the second raw material is $Si[OCH(CH_3)CH_2N(CH_3)_2]_4$ or $Si[OC(CH_3)_2CH_2N(CH_3)_2]_4$.

A sixteenth aspect of the invention is the substrate processing apparatus of the thirteenth aspect wherein the metal is hafnium, and the metal silicate film is a hafnium silicate film.

The ability to control the concentration ratio of the Hf atom and Si atom in the hafnium silicate film can be improved if the metal is hafnium, and the film formed in the step of forming a metal silicate film is a hafnium silicate film.

A seventeenth aspect of the invention is the substrate processing apparatus of the thirteenth aspect wherein the first raw material is $Hf[OC(CH_3)_2CH_2OCH_3]_4$; the second raw material is $Si[OCH(CH_3)CH_2N(CH_3)_2]_4$; the metal silicate film is a hafnium silicate film; and the controller has a controlling function such that a step of vaporizing the first raw material and the second raw material, supplying the vaporized raw materials to the processing chamber, and forming the hafnium silicon film on a substrate via MOCVD is repeated with a reforming step of supplying into the processing chamber a reaction gas that is different from the first raw material and the second raw material, and reforming the hafnium silicate film, whereby a hafnium silicate film is formed to a desired thickness on the substrate.

The ability to control the raw material supply ratio will be improved and the ability to control the concentration ratio in the metal silicate film can be further improved because variation in the raw material supply ratio is minimized when the sequential process is thus performed.

An eighteenth aspect of the invention is the substrate processing apparatus of the seventeenth aspect wherein a gas that is activated by remote plasma is used in the reforming step.

The reforming can be performed efficiently and the manufacturing device can be reduced in size when a gas that is activated by remote plasma is used in the reforming step.

A nineteenth aspect of the invention is the substrate processing apparatus of the seventeenth aspect wherein the gas activated by remote plasma is a gas that contains oxygen or a gas that contains nitrogen.

The gas activated by remote plasma is preferably a gas that contains oxygen or a gas that contains nitrogen.

A twentieth aspect of the invention is the substrate processing apparatus of the seventeenth aspect wherein, in the film forming step, the first raw material and the second raw material vaporized respectively, subsequently mixed, and fed into the processing chamber, whereupon the hafnium silicate film is formed on the substrate.

The ability to control the raw material supply ratio will be improved and the ability to control the concentration ratio in the metal silicate film can be further improved if the first and raw material and the second raw material vaporized respectively, subsequently mixed, and then fed into the processing chamber.

A twenty-first aspect of the invention is the substrate processing apparatus of the seventeenth aspect wherein the first and raw material and the second raw material used, and either the first raw material or the second raw material is mixed with the other for use as a raw material.

The ability to control the raw material supply ratio will be improved and the ability to control the concentration ratio in the metal silicate film can be further improved if the first raw material and the second raw material used, and either the first raw material or the second raw material is mixed with the other for use as a raw material.

A twenty-second aspect of the invention is the substrate processing apparatus of the seventeenth aspect wherein the first raw material is $Hf[OC(CH_3)_2CH_2OCH_3]_4$; the second raw material is $Si[OCH(CH_3)CH_2N(CH_3)_2]_4$; the metal silicate film is a hafnium silicate film; and the controller controls a raw material supply ratio Hf/(Hf+Si) in a step of forming the metal silicate film, whereby a concentration ratio Hf/(Hf+Si) of the Hf atom and Si atom in the resulting hafnium silicate film is controlled.

The ability to control the raw material supply ratio can be improved and the ability to control the concentration ratio in the hafnium silicate film can be further improved if the above raw materials are used and the raw material supply ratio Hf/(Hf+Si) is controlled to control the concentration ratio Hf/(Hf+Si) of the Hf atom and Si atom in the resulting hafnium silicate film.

A twenty-third aspect of the invention is the substrate processing apparatus of the twenty-second aspect wherein the controller additionally has a function for continuously or gradually varying the raw material supply ratio Hf/(Hf+Si) in one step of forming the metal silicate film, whereby the concentration ratio Hf/(Hf+Si) of Hf atom and Si atom in the resulting hafnium silicate film is controlled in a depth direction.

The ability to control the concentration ratio of the Hf atom and Si atom in the hafnium silicate film can be further improved, even if the raw material supply ratio is thus continuously or gradually varied. Further, if the concentration ratio of the Hf atom and Si atom in the resulting hafnium silicate film is thus controlled in a depth direction, the ability to control the concentration ratio of the Hf atom and Si atom in the depth direction will also be improved. It will also be possible to obtain a desired nitrogen concentration distribution in the depth direction in the film when the hafnium silicate film is subsequently subjected to nitridation.

EFFECT OF THE INVENTION

According to the present invention, the concentration ratio of the metal atom and the silicon atom in a metal silicate film can be readily controlled, and a high-quality semiconductor device can be manufactured.

BEST MODE FOR CARRYING OUT THE INVENTION

Embodiments of the present invention will be described based on the drawings.

The following is a detailed description of embodiments in which CVD, i.e., MOCVD is used to form an amorphous hafnium silicate film (abbreviated below simply as "an HfSiO film").

Figure 1:
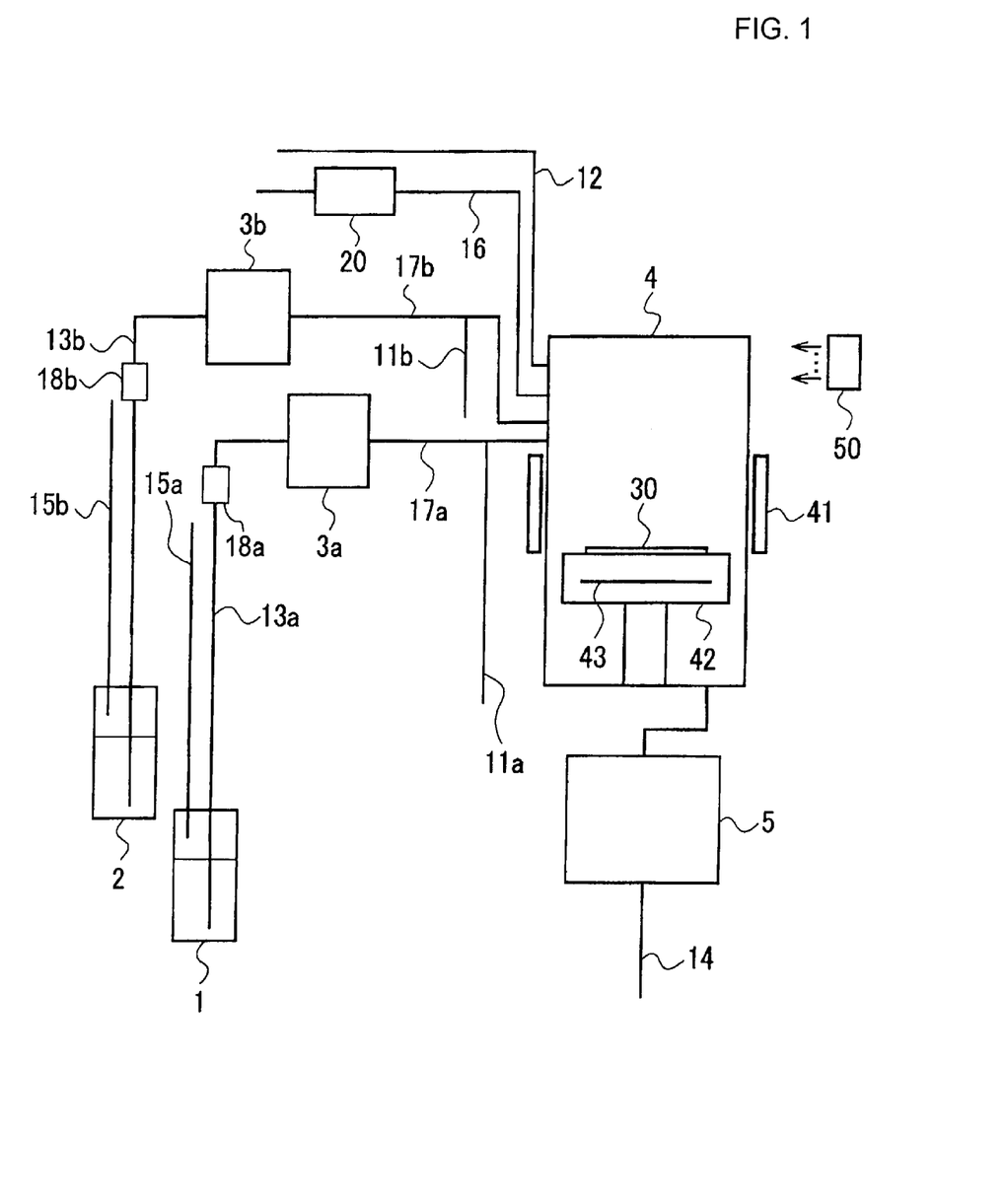
FIG. 1 is a sectional view that schematically shows a substrate processing device according to an embodiment of the present invention.

FIG. 1 is a schematic view showing an example of a single-wafer CVD device, which is a substrate processing apparatus according to the present embodiment. A processing chamber 4 in which a silicon wafer or other substrate 30 is treated is provided with a susceptor 42 as a substrate support platform for supporting the substrate 30. A heater 43 for heating the substrate 30 is embedded in the susceptor 42. A heater 41 for heating the walls of the processing chamber is embedded in the walls of the processing chamber.

Connected to the processing chamber 4 are an Hf raw material gas supply pipe 17a for supplying an Hf raw material gas as a first raw material containing metal atoms; an Si raw material gas supply pipe 17b for supplying an Si raw material gas containing nitrogen (simply referred to as "Si raw material gas" below) as a second raw material containing silicon atoms and nitrogen atoms; an inert gas supply pipe 12 for supplying $N_2$ or another inert gas; and an oxidizing gas supply pipe 16 for supplying oxygen (oxidizing gas) that is activated by remote plasma. The Hf raw material gas supply pipe 17a and the Si raw material gas supply pipe 17b have a vent pipe 11a and a vent pipe 11b, respectively. The Hf raw material gas supply pipe 17a and the Si raw material gas supply pipe 17b are also connected to a vaporizer 3a and a vaporizer 3b, respectively, for vaporizing the Hf liquid raw material and the Si liquid raw material. The vaporizer 3a and vaporizer 3b are also connected to an Hf liquid raw material supply pipe 13a and an Si liquid raw material supply pipe 13b, respectively. The Hf liquid raw material supply pipe 13a and Si liquid raw material supply pipe 13b are provided with a liquid flow-rate control device 18a and a liquid flow-rate control device 18b, respectively. The Hf liquid raw material supply pipe 13a and Si liquid raw material supply pipe 13b are also connected to an Hf liquid raw material container 1 and an Si liquid raw material container 2, respectively. The raw material container 1 and raw material container 2 are connected to a pumping gas supply pipe 15a and a pumping gas supply pipe 15b, respectively, for supplying pumping gas for expelling the raw materials in the containers to the Hf liquid raw material supply pipe 13a and the Si liquid raw material supply pipe 13b. In this configuration, $N_2$ or another pumping gas is supplied to the raw material container 1 and the raw material container 2, whereby the respective raw materials are expelled to the liquid raw material supply pipes 13a, 13b. The flow rate of the expelled liquid raw materials is controlled by the liquid flow-rate control device 18a and the liquid flow-rate control device 18b. The raw materials having a controlled flow rate are then vaporized by the vaporizers 3a, 3b and supplied as a raw material gas to the interior of the processing chamber 4 via the raw material gas supply pipes 17a, 17b. It is possible to activate the oxidizing gas by using a remote plasma unit 20, and then supply the oxidizing gas to the processing chamber 4.

A discharge pipe 14 for evacuating the processing chamber is connected to the processing chamber 4, and a vacuum pump or other exhaust device 5 is connected to the discharge pipe 14. The gas introduced to the processing chamber 4 is brought by the discharge pipe 14 and the exhaust device 5 to a pre-treatment device (not shown) or other downstream apparatus. A heating device (not shown) is disposed in the pipe in the drawings.

A transport chamber (not shown) is placed adjacent to the processing chamber 4 via a gate valve, and the transport chamber is connected to a cooling chamber and a load lock chamber. The transport chamber has a transport mechanism, and the substrate is brought from the transport chamber to the processing chamber 4. Film forming and other treatments are carried out in the processing chamber 4, and the substrate is then loaded to the cooling chamber by way of the transport chamber.

A controller 50, which is a control device, controls the operation of the constituent parts of a single-wafer CVD device, including the liquid flow-rate control devices 18a, 18b; the vaporizers 3a, 3b; the remote plasma unit 20, the exhaust device 5, the substrate-heating heater 43 embedded in the susceptor 42; and the heater 41 that is used for heating the processing chamber walls and is embedded in the processing chamber walls.

Described next is a sequence in which a single-wafer CVD device having the structure described above with reference to FIG. 1 is used to deposit an HfSiO film according to the embodiments of the present invention by MOCVD based on the cycle technique. An example will be described in which the Hf raw material is Hf-MMP (100%), the Si raw material is N-containing $Si[OCH(CH_3)CH_2N(CH_3)_2]_4$ and tetrakis(1-dimethylamino-2-propoxy)silane) (abbreviated simply as Si-DMAP below), the inert gas is nitrogen ($N_2$)/argon (Ar), and the oxidizing gas is oxygen ($O_2$).

Unless otherwise noted, molar ratios are expressed as percentages (%).

In the description below, the operation of the constituent parts of the single-wafer CVD device is controlled by the controller 50.

Figure 2:
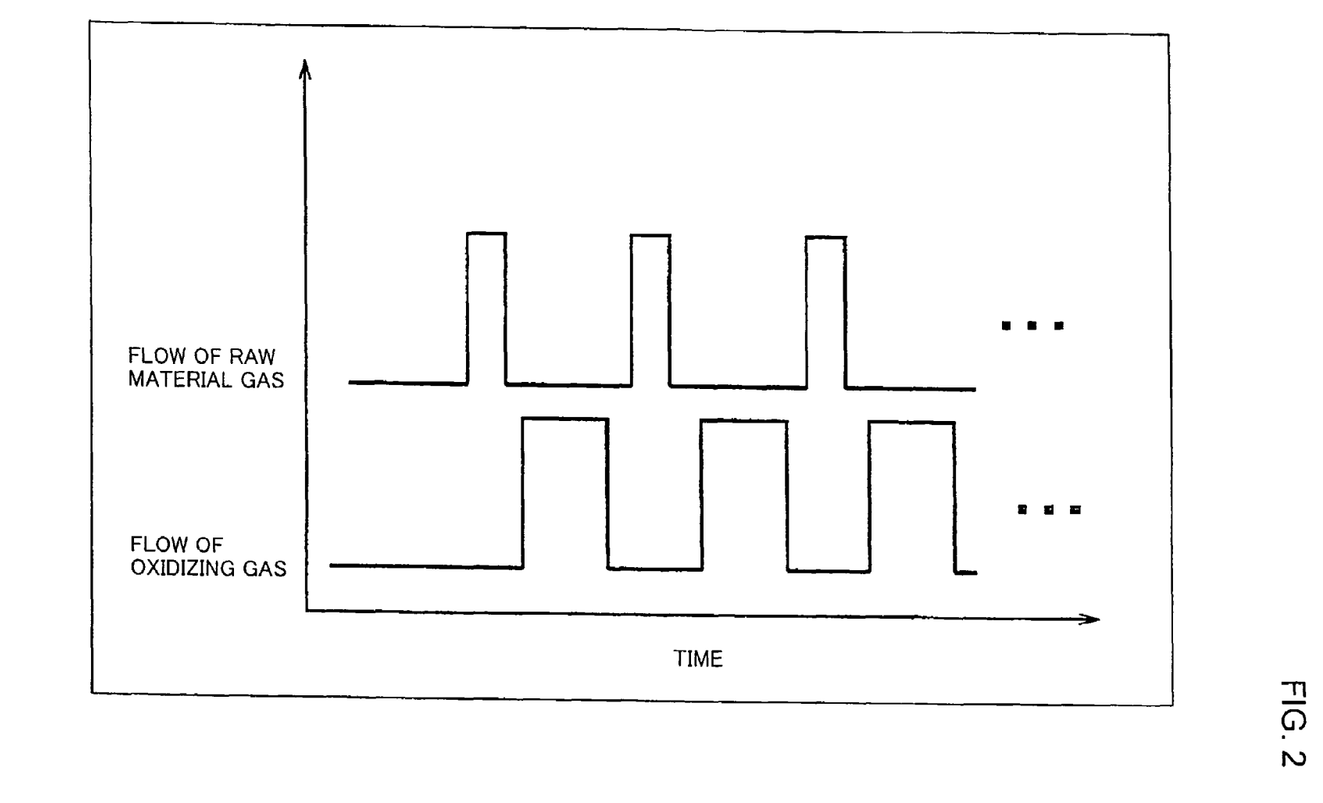
FIG. 2 is a diagram showing a sequence for forming a film in the embodiment.

A substrate is loaded from the transport chamber into the processing chamber 4 by a transport mechanism. The temperature of the substrate is raised to the treatment temperature, and the pressure in the processing chamber 4 is adjusted to the treatment pressure. Subsequently, a film is formed using the raw material gases, i.e., an Hf raw material gas formed by vaporizing Hf-MMP in the vaporizer 3a, and an Si raw material gas formed by vaporizing Si-DMAP in the vaporizer 3b. The film is reformed by oxygen (oxidizing gas) that is activated using remote plasma from the remote plasma unit 20. These steps are alternately performed a plurality of times, as shown in FIG. 2. An HfSiO film is thereby formed on the substrate 30. Purging with an inert gas, e.g., $N_2$ purging, is carried out between the step of forming a film by supplying raw material gases (Hf raw material gas, Si raw material gas) and the step of reforming the film by supplying oxidizing gas. Specifically, a single unit (cycle) is performed in the sequence "film-forming step, purging, reforming step, $N_2$ purging." This sequence can be repeated any number of times to obtain a desired film thickness. The term "any number of times" refers to the result of dividing the desired film thickness by the film thickness obtained by the sequence constituting one unit.

The Hf raw material gas and the Si raw material gas may be supplied simultaneously to the substrate, or the gases may be supplied gradually, i.e., separately. In the reforming step, an oxygen-containing gas or nitrogen-containing gas, e.g., $O_2$, $N_2O$, $N_2$, or $NH_3$, is used as the oxidizing gas activated by the remote plasma unit 20.

Figure 4:
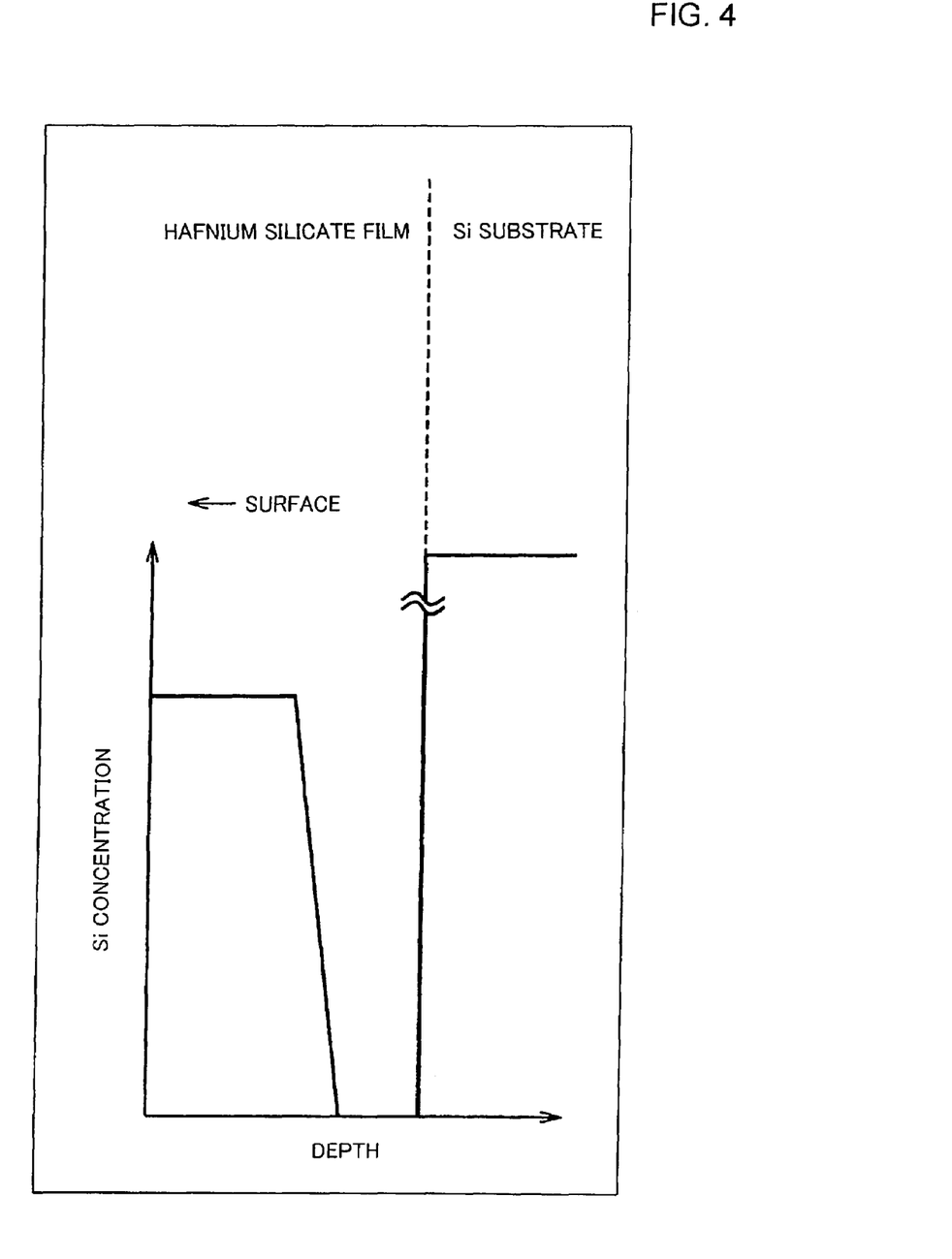
FIG. 4 is a diagram showing an Si concentration distribution in an HfSiO film of the embodiment.
Figure 5:
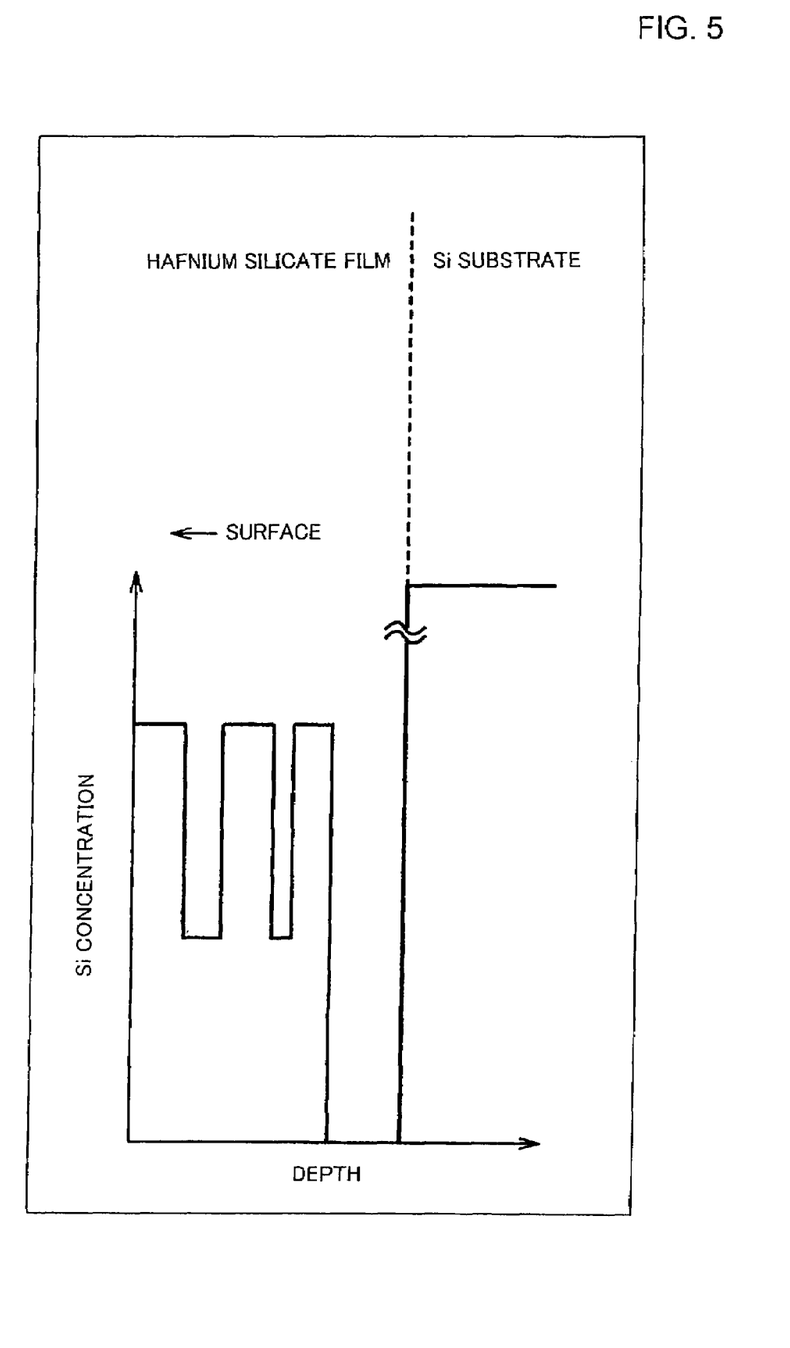
FIG. 5 is a diagram showing an Si concentration distribution in an HfSiO film of the embodiment.
Figure 6:
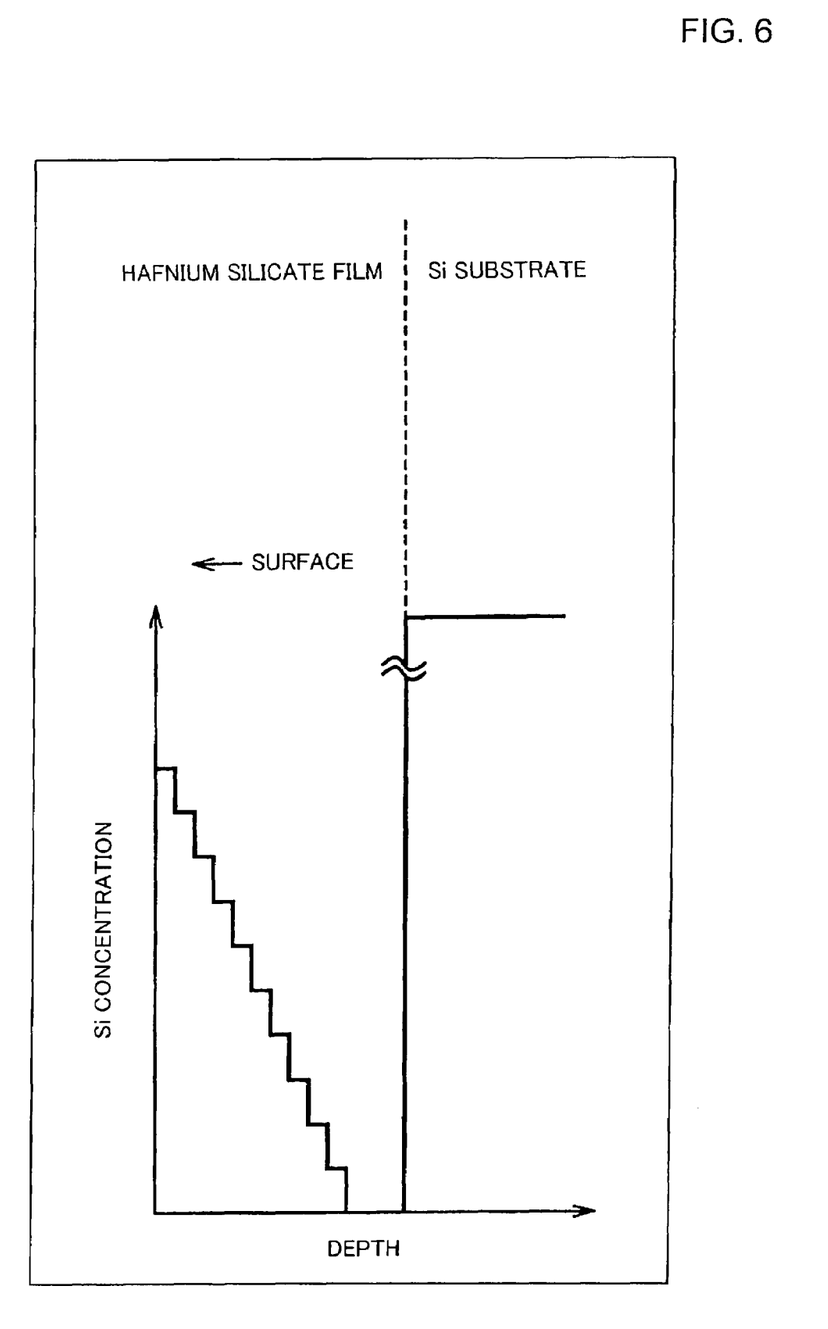
FIG. 6 is a diagram showing an Si concentration distribution in an HfSiO film of the embodiment.

When the raw material gas is supplied, the raw material supply ratio Hf/(Hf+Si) may be constant or varied in the course of a single unit (cycle) in which the Hf raw material and Si raw material is supplied, and $N_2$ purging is carried out. The raw material supply ratio Hf/(Hf+Si) can be continuously or gradually varied while repeating the process any number of times to obtain a desired film thickness, whereby it is possible to control the concentration of the Hf atoms and Si atoms in the depth direction of the HfSiO film thus formed, as shown in FIGS. 4, 5, 6. Here, FIG. 4 shows a case in which the raw material supply ratio is continuously varied and then held constant from an intermediate point on, FIG. 5 shows two raw material supply ratios being alternately repeated, and FIG. 6 shows a stepwise variation.

Figure 3:
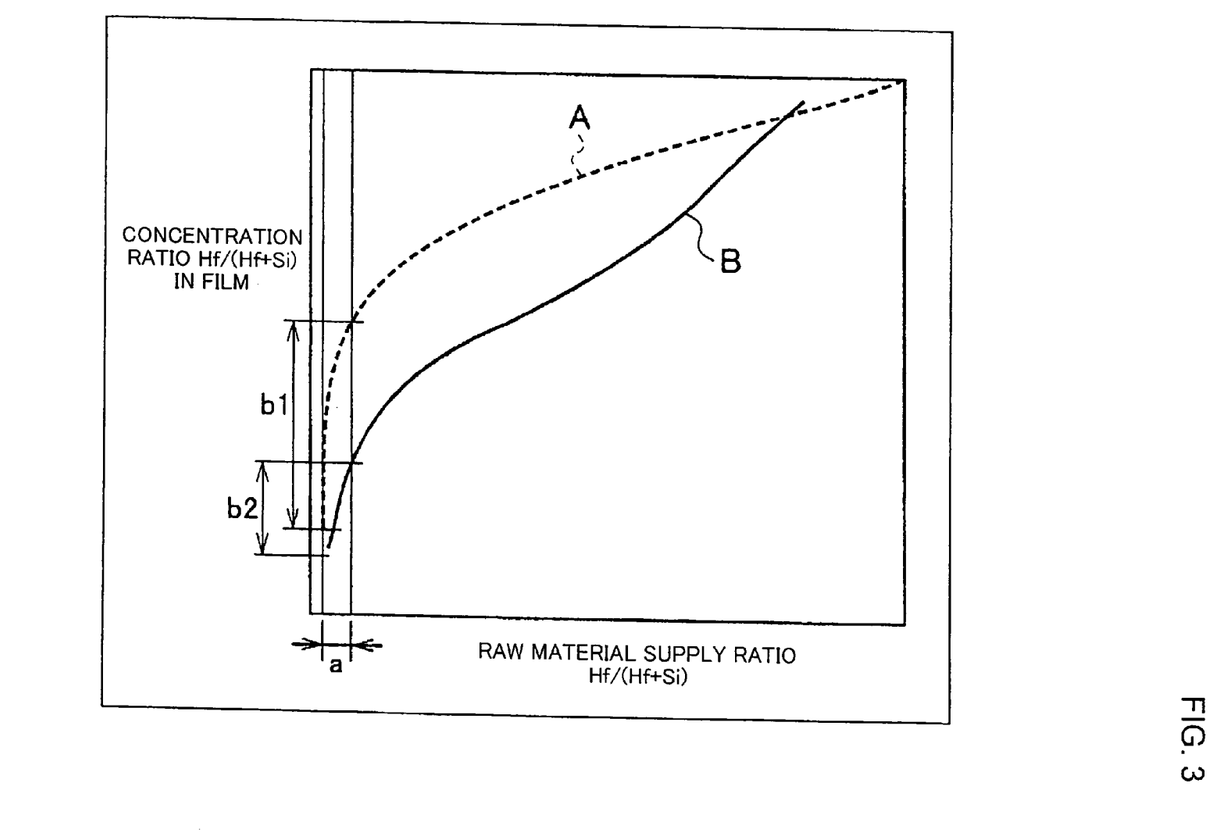
FIG. 3 is a characteristics diagram showing the correlation between the raw material supply ratio Hf/(Hf+Si) and concentration ratio Hf/(Hf+Si) in the film of the embodiment.

Thus, the reason that the Hf atom and Si atom concentration ratio in the HfSiO film can be controlled in the depth direction is that there is a correlation during film forming between the Hf/(Hf+Si) concentration ratio in the film and the raw material supply ratio of the Hf raw material (Hf-MMP) and the Si raw material (Si-DMAP) in a single unit of supplying the raw material and purging, as shown by solid line B in FIG. 3. The concentration ratio Hf/(Hf+Si) in the film can be controlled by controlling the raw material supply ratio Hf/(Hf+Si) during film formation.

FIG. 3 shows a relationship between the raw material supply ratio Hf/(Hf+Si) and the concentration ratio Hf/(Hf+Si) in the HfSiO film obtained as a result of the raw material supply ratio. In this case, the film forming temperature is 450° C. and the pressure is 100 Pa.

The method of supplying the raw materials may involve using Si-DMAP premixed with trace amounts of Hf-MMP as an Si raw material, or subsequently mixing Hf-MMP (100%) and Si-DMAP (100%), instead of using a premixed raw material. In the case that the raw materials are subsequently mixed, the Si raw material may be supplied by mixing trace amounts of Hf-MMP with the Si-DMAP in the processing chamber 4, or in the Hf raw material gas supply pipe 17a and the Si raw material gas supply pipe 17b that lead to the vaporizer 3a and the vaporizer 3b. Also, the raw materials may be supplied as an Hf/Si mixed raw material.

For example, when a film is formed by using Hf-MMP (100%) and Si-DMAP (100%) at a raw material supply ratio Hf/(Hf+Si) of 1/8, the concentration ratio Hf/(Hf+Si) in the HfSiO film is 45%. When a film is formed by using a raw material supply ratio Hf/(Hf+Si) of 1/20, it is possible to achieve a concentration ratio Hf/(Hf+Si) of 30% in the HfSiO film.

In the case that the raw material supply ratio is controlled, the Si concentration is preferably increased on the top side of the film (side opposite active region of a transistor when a device is formed), and the Si concentration is preferably reduced on the bottom side of the film (side of the active region of transistor when a device is formed). Specifically, the Si concentration of the HfSiO film surface side may be greater than on the substrate side, and the Hf concentration of the substrate side may be greater than the HfSiO film surface side. Thus, a film is formed so that the HfSiO film surface side is more Si-rich than the substrate side, and the substrate side is more Hf-rich than the HfSiO film surface side. It is thereby possible to introduce a large amount of nitrogen into the Si-rich layer on the HfSiO film surface side by a nitridation treatment described below, without introducing nitrogen into the Hf-rich layer on the substrate side.

FIG. 2 shows a case in which activated oxidizing gas is supplied after the raw material gases are supplied, but the raw material gases may also be supplied after the oxidizing gas has been supplied. Oxidizing gas that is activated by remote plasma is first supplied to the substrate, whereby it is possible to improve the properties of the deposited film. This may be accomplished by a method such as the one proposed in JP-A 2004-6699 including depositing a film by MOCVD, oxidation by a gas activated by remote plasma, and intermittent repetition of the reforming of the deposited film. However, a method may be used in which a deposited film is formed by basic MOCVD, without intermittent repetition. The term "basic MOCVD" means a method for obtaining a film by supplying the raw materials simultaneously or sequentially, without a repetitious sequence. The reforming treatment and oxidation of the film by a gas activated by remote plasma are also known as an RPO (Remote Plasma Oxidation) treatment.

A nitridation treatment is carried out after the HfSiO film has been deposited using the sequence described above. Specifically, a nitridation treatment is carried out on an HfSiO film formed so that the Si concentration in the film has a predetermined distribution, e.g., an HfSiO film in which the Si concentration is greater on the film surface side than the substrate side, and the Hr concentration is greater on the substrate side than the film surface side. An HfSiO film is thereby obtained that has a nitrogen concentration distribution, i.e., a distribution in which the film surface side has a greater N concentration than the substrate side. It is thereby possible to prevent boron from penetrating the film surface side, and it is possible to increase the thermal resistance overall. Thus, the reason it is possible to introduce a large amount of nitrogen into the HfSiO film surface side without introducing nitrogen into the substrate side (interface with the substrate) is that more nitrogen can be introduced into the film at higher silicon compositions in the silicate film.

Here, the nitridation treatment was carried out by a method in which nitrogen ($N_2$), ammonia ($NH_3$), or another nitrogen-containing gas is used during resistance heating or rapid thermal annealing (RTA) using a light source. Specifically, examples include an RTN (rapid thermal nitridation) treatment, an RPN (remote plasma nitridation) treatment in which ammonia, nitrogen, or another substance activated by remote plasma is used, or an MMT (modified magnetron typed plasma source) nitridation treatment. It is possible to obtain a nitrogen concentration distribution that reflects the Si concentration distribution in the HfSiO film, regardless of the nitridation treatment method that is used. It is thereby possible to widen the range of control for the nitrogen concentration distribution.

A description has been provided above of an embodiment wherein an HfSiO film is deposited using Hf-MMP as the Hf raw material for MOCVD, and nitrogen-containing Si-DMAP as the Si raw material. However, for purposes of comparison, a description shall also be provided of a case in which an HfSiO film is deposited using Hf-MMP as the Hf raw material, and Si-MMP, which does not contain nitrogen, as the Si raw material.

The dotted line A shown in FIG. 3 is a characteristics curve showing the correlation between the raw material supply ratio Hf/(Hf+Si) and the concentration ratio Hf/(Hf+Si) in the film when Hf-MMP and Si-MMP are used as described above. As shall be evident, the correlation for the raw material supply ratio Hf/(Hf+Si) and the concentration ratio Hf/(Hf+Si) in the film is the same as that shown by the solid line B, even when Hf-MMP and Si-MMP are used. Accordingly, the concentration ratio Hf/(Hf+Si) in the HfSiO film can be changed by controlling the raw material supply ratio Hf/(Hf+Si), even when such raw materials are used.

However, as shown in FIG. 3, no sharp gradient is obtained overall when Si-DMAP is used (solid line B) in comparison to when Si-MMP is used (dotted line A). Moreover, as is particularly so in the region where the raw material supply ratio Hf/(Hf+Si) is low, the gradient when Si-DMAP is used (solid line B) is smaller than when Si-MMP is used (dotted line A). FIG. 3 shows that the use of Si-DMAP leaves some margin in the raw material supply ratio, particularly when a film with a high Si concentration; i.e., a low Hf concentration, is formed. A further description shall be provided in regard thereto.

In the case that the first (Hf) raw material and the second (Si) raw material used to control the raw material supply ratio Hf/(Hf+Si), thereby controlling the raw material supply ratio Hf/(Hf+Si) in the resulting HfSiO film, the ability with which the concentration ratio in the film can be controlled is determined in accordance with the degree to which the concentration ratio in the film is changed with respect to the raw material supply ratio.

For example, the degree of change will be large when a steep gradient exists in the correlation between the concentration ratio in the film and the raw material supply ratio. Therefore, the concentration ratio in the film will change dramatically merely by a slight change in the raw material supply ratio. Accordingly, the concentration ratio in the film will be harder to control when a distribution is obtained for the raw material supply ratio.

When Hf-MMP and Si-MMP are used, as in the comparative example, a relationship such as the one indicated by the dotted line A will be obtained between the raw material supply ratio and the concentration ratio in the film. The degree of change in the concentration ratio in the film relative to the raw material supply ratio will accordingly be small when the amount of Si introduced is small (when the raw material supply ratio Hf/(Hf+Si) is large). Accordingly, the concentration ratio in the film will not change dramatically merely from a slight change in the raw material supply ratio. However, and in particular, the degree of change in the concentration ratio in the film relative to the raw material supply ratio will be large when the amount of Si introduced is large (when the raw material supply ratio Hf/(Hf+Si) is small). Accordingly, the concentration ratio in the film will change dramatically merely from a slight change in the raw material supply ratio. For example, the concentration ratio in the film will change dramatically over the range shown by $b_1$ merely from a slight change in the raw material supply ratio over the narrow range shown by a. The concentration ratio in the film is accordingly thought to be difficult to control when a distribution (variation) has been obtained for the raw material supply ratio.

However, when Hf-MMP is used as the first (Hf) raw material and Si-DMAP is used as the second (Si) raw material to control the raw material supply ratio, as indicated by the embodiment, no overall sharp gradient is exhibited, as shown by the solid line B. Furthermore, even when a large amount of Si has been introduced, the degree of change will be relatively small in the concentration ratio in the film relative to the raw material supply ratio. Accordingly, the degree of change in the concentration ratio in the film will be small even with some degree of variation in the raw material supply ratio. For example, even if the raw material supply ratio varies over the range shown by a, the concentration ratio in the film will only undergo a slight change within the range indicated by $b_2$ ($b_2 < b_1$). As a result, the concentration ratio in the film will be readily controllable regardless of how much Si has been introduced, even if a distribution is obtained for the raw material supply ratio. Even when a large amount of Si is introduced, a margin will be provided in regard to setting the amount of the Hf and Si raw materials to be supplied, and the Hf and Si concentration ratio in the HfSiO film will be particularly simple to control.

Using Si-DMAP as the Si raw material thus makes it possible to confirm that the amount of Si introduced into the film can be readily controlled.

A description is provided below on the presumed reason that a difference is obtained in regard to the aforedescribed controllability when Si-MMP or Si-DMAP is used as the Si raw material when the HfSiO film is formed. Low temperatures are usually desired when the film is formed, but when CVD is performed using Si-MMP, a film cannot be formed at temperatures of less than 450° C. even in an oxygen atmosphere. Studies have been performed on film characteristics; e.g., adding Si to an $HfO_2$ film to improve the heat resistance thereof. However, Si-MMP is not a highly reactive raw material, and cannot be used alone to form a film. Accordingly, when Si-MMP is used as an Si raw material, controlling the amount of Si added to the $HfO_2$ film is thought to be difficult. By contrast, Si-DMAP, unlike Si-MMP, contains nitrogen (N) as well as oxygen (O), carbon (C), and hydrogen (H) as structural elements; and is a raw material exhibiting higher reactivity. $SiO_2$ films can be formed using Si-DMAP either alone as a raw material, or in conjunction with oxygen. It is accordingly thought that the amount of Si introduced into the film can be readily controlled when Si-DMAP is used as an Si raw material.

As long as a highly reactive raw material is used; e.g., an $SiO_2$ film can be formed from the Si raw material alone, then the same effect can thus be expected to occur in the present invention with an Si raw material other than Si-DMAP. For example, the same effect can be expected when using $Si[OC(CH_3)_2CH_2N(CH_3)_2]_4$, tetrakis(1-dimethylamino-2-methyl-2-propoxy)silane ("Si-DMAMP" hereunder), or another Si raw material besides Si-DMAP.

As has been described above, according to the present embodiment, there is used a relatively highly reactive raw material that enables an $SiO_2$ film to be formed using Si-DMAP, Si-DMAMP, or another Si raw material alone, or in conjunction with oxygen. By using this raw material, a margin will be created for setting the amount of Hf and Si raw materials supplied when forming an HfSiO film, even if a large amount of Si is introduced, and it will be possible to improve the ability to control the concentration ratio when a film is formed while the raw material supply ratio is controlled.

The same effect can be expected when forming HfSiO films, even if the raw material gas is a combination of, e.g., $Hf[N(C_2H_5)_2]_4$ and $HSi[N(CH_3)_2]_3$ or $Si[N(CH_3)_2]_4$. The same effect can also be expected even if the Hf and Si raw materials (containing nitrogen) are both organic materials. In other words, the same effect can be expected not only when using a combination of an organic Hf raw material and an organic Si raw material, but also when using a combination of an organic Hf raw material and an inorganic Si raw material (containing nitrogen), a combination of an inorganic Hf raw material and an organic Si raw material (containing nitrogen), and a combination of an inorganic Hf raw material and an inorganic Si raw material (containing nitrogen).

KEY

4 Processing chamber
17a Hf raw material gas supply pipe (supply port for supplying first raw material)
17b Si raw material gas supply pipe (supply port for supplying second raw material)
30 Substrate
50 Controller (control device)

The invention claimed is:

1. A method for manufacturing a semiconductor device including the steps of:
   loading a substrate into a processing chamber;
   supplying a first raw material, which contains a metal atom, and a second raw material, which contains a silicon atom and a nitrogen atom, into said processing chamber; and forming on said substrate a metal silicate film containing the metal atom and the silicon atom; and
   unloading from said processing chamber said substrate after film formation; wherein in the step of forming said metal silicate film, a raw material supply ratio of said first raw material and said second raw material is controlled, whereby a concentration ratio of the metal atom and the silicon atom in the resulting metal silicate film is controlled, wherein said second raw material is Si[OCH(CH3)CH2N(CH3)2]4 or Si[OC(CH3)2CH2N(CH3)2]4.

2. A method for manufacturing a semiconductor device including the steps of:

loading a substrate into a processing chamber;

supplying a first raw material, which contains a metal atom, and a second raw material, which contains a silicon atom and a nitrogen atom, into said processing chamber; and forming on said substrate a metal silicate film containing the metal atom and the silicon atom; and unloading from said processing chamber said substrate after film formation; wherein in the step of forming said metal silicate film, a raw material supply ratio of said first raw material and said second raw material is controlled, whereby a concentration ratio of the metal atom and the silicon atom in the resulting metal silicate film is controlled, wherein said first raw material is Hf[OC(CH3)2CH2OCH3]4, and said second raw material is Si[OCH(CH3)CH2N(CH3)2]4 or Si[OC(CH3)2CH2N(CH3)2]4.

3. A method for manufacturing a semiconductor device including the steps of:

loading a substrate into a processing chamber;

supplying a first raw material, which contains a metal atom, and a second raw material, which contains a silicon atom and a nitrogen atom, into said processing chamber; and forming on said substrate a metal silicate film containing the metal atom and the silicon atom; and unloading from said processing chamber said substrate after film formation; wherein in the step of forming said metal silicate film, a raw material supply ratio of said first raw material and said second raw material is controlled, whereby a concentration ratio of the metal atom and the silicon atom in the resulting metal silicate film is controlled, wherein said first raw material is Hf[OC(CH3)2CH2OCH3]4; said second raw material is Si[OCH(CH3)CH2N(CH3)2]4; said metal silicate film is a hafnium silicate film; and, in the step of forming said metal silicate film, a film-forming step of vaporizing said first raw material and said second raw material, supplying the vaporized raw materials into said processing chamber, and forming said hafnium silicate film on the substrate via MOCVD is repeated with a reforming step of feeding into said processing chamber a gas that is different from said first raw material and said second raw material, and reforming said hafnium silicate film, whereby a hafnium silicate film is formed to a desired thickness on the substrate.

4. The method for manufacturing a semiconductor device of claim 3 wherein, in said film forming step, said first raw material and said second raw material are vaporized respectively and subsequently fed into said processing chamber without being mixed in advance.

5. The method for manufacturing a semiconductor device of claim 3 wherein, in said film forming step, said first raw material and said second raw material vaporized respectively, subsequently mixed, and then fed into said processing chamber.

6. The method for manufacturing a semiconductor device of claim 3 wherein, in said film forming step, a mixed raw material, which is obtained by mixing either said first raw material or said second raw material with the other, is vaporized and subsequently fed into said processing chamber.

7. The method for manufacturing a semiconductor device of claim 3 wherein, in said film forming step, a raw material supply ratio Hf/(Hf+Si) is controlled, whereby a concentration ratio Hf/(Hf+Si) of Hf atom and Si atom in the resulting hafnium silicate film is controlled.

8. The method for manufacturing a semiconductor device of claim 7 wherein, in said film forming step, a raw material supply ratio Hf/(Hf+Si) is continuously or gradually varied, whereby a concentration ratio Hf/(Hf+Si) of Hf atom and Si atom in a depth direction in the resulting hafnium silicate film is controlled.

* * * * *